(12) United States Patent  
Jiang et al.

(10) Patent No.: US 12,185,621 B2  
(45) Date of Patent: Dec. 31, 2024

(54) DISPLAY PANEL, METHOD FOR MANUFACTURING THE SAME AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhiliang Jiang, Beijing (CN); Pan Zhao, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 817 days.

(21) Appl. No.: 17/288,121

(22) PCT Filed: Aug. 4, 2020

(86) PCT No.: PCT/CN2020/106727  
§ 371 (c)(1),  
(2) Date: Apr. 23, 2021

(87) PCT Pub. No.: WO2021/027618  
PCT Pub. Date: Feb. 18, 2021

(65) Prior Publication Data  
US 2021/0384428 A1    Dec. 9, 2021

(30) Foreign Application Priority Data  
Aug. 12, 2019   (CN) .......................... 201910739242.5

(51) Int. Cl.  
*H10K 71/80*   (2023.01)  
*H10K 50/86*   (2023.01)  
(Continued)

(52) U.S. Cl.  
CPC ............. *H10K 71/80* (2023.02); *H10K 50/86* (2023.02); *H10K 59/12* (2023.02); *H10K 59/40* (2023.02);  
(Continued)

(58) Field of Classification Search  
CPC ........ H10K 71/80; H10K 50/86; H10K 59/12; H10K 59/40; H10K 71/00; H10K 59/1201; H10K 2102/103; H10K 77/111  
See application file for complete search history.

(56) References Cited

U.S. PATENT DOCUMENTS

| 2011/0217524 A1 | 9/2011 | Kim |
| 2014/0001626 A1* | 1/2014 | Yamazaki .............. H10K 50/87 257/705 |

(Continued)

FOREIGN PATENT DOCUMENTS

| CN | 103872069 A | 6/2014 |
| CN | 104347007 A | 2/2015 |

(Continued)

OTHER PUBLICATIONS

International Search Report received for PCT Patent Application No. PCT/CN2020/106727, mailed on Nov. 10, 2020, 5 pages (2 pages of English Translation and 3 pages of Original Document).

(Continued)

*Primary Examiner* — Nicholas J Tobergte  
*Assistant Examiner* — Adin Hrnjic  
(74) *Attorney, Agent, or Firm* — Calfee, Halter & Griswold LLP

(57) ABSTRACT

The present disclosure relates to the field of display technologies, and in particular, to a display panel, a method for manufacturing the same and a display device. The display panel includes a first layer; a first adhesive layer on the first layer; an array substrate on the first adhesive layer; a second (Continued)

adhesive layer on the array substrate and including a same material as the first adhesive layer; and a second layer on the second adhesive layer and including a same material as the first layer.

7 Claims, 2 Drawing Sheets

(51) Int. Cl.
   *H10K 59/12* (2023.01)
   *H10K 59/40* (2023.01)
   *H10K 71/00* (2023.01)
   *H10K 102/10* (2023.01)

(52) U.S. Cl.
   CPC ......... *H10K 71/00* (2023.02); *H10K 59/1201* (2023.02); *H10K 2102/103* (2023.02)

(56) References Cited

U.S. PATENT DOCUMENTS

| | | | |
|---|---|---|---|
| 2014/0085636 A1* | 3/2014 | Yang | G01N 21/8806 356/364 |
| 2014/0166995 A1 | 6/2014 | Lee et al. | |
| 2015/0036269 A1 | 2/2015 | Kim et al. | |
| 2015/0314561 A1 | 11/2015 | Kim et al. | |
| 2016/0124254 A1 | 5/2016 | Yoon et al. | |
| 2016/0207295 A1 | 7/2016 | Seo et al. | |
| 2019/0006620 A1* | 1/2019 | Kim | G02B 5/30 |
| 2021/0242288 A1 | 8/2021 | Zhao | |

FOREIGN PATENT DOCUMENTS

| | | |
|---|---|---|
| CN | 208240682 U | 12/2018 |
| CN | 109148515 A | 1/2019 |
| CN | 109638060 A | 4/2019 |
| CN | 109709707 A | 5/2019 |
| CN | 109712528 A | 5/2019 |
| CN | 209028241 U | 6/2019 |
| CN | 110429123 A | 11/2019 |

OTHER PUBLICATIONS

Office Action received for Chinese Patent Application No. 201910739242.5, mailed on Jul. 12, 2021, 17 pages (9 pages of English Translation and 8 pages of Office Action).

Office Action received for Chinese Patent Application No. 201910739242.5, mailed on Mar. 31, 2021, 17 pages (9 pages of English Translation and 8 pages of Office Action).

* cited by examiner

DISPLAY PANEL, METHOD FOR MANUFACTURING THE SAME AND DISPLAY DEVICE

RELATED APPLICATIONS

The present application is a 35 U.S.C. 371 national stage application of PCT International Application No. PCT/CN2020/106727, filed on Aug. 4, 2020, which claims the benefits of Chinese patent application No. 201910739242.5 filed on Aug. 12, 2019, the entire disclosures of which are incorporated herein by reference.

TECHNICAL FIELD

This disclosure relates to the field of display technologies, and in particular to a display panel, a method for manufacturing the same and a display device.

BACKGROUND

Since the high screen-to-body ratio of the full screen can provide consumers with a better visual experience, more and more consumers are showing great interest in full screen products. When manufacturing a full-screen display panel, it is usually necessary to bend edges of both sides of the display panel. However, during the edge bending process, the display panel is prone to cracks due to stress concentration and other reasons. Especially in the case of an organic light emitting diode (OLED) display panel, water and oxygen in the environment penetrate the organic light emitting diode display panel along the cracks and corrode the organic light emitting layer of the organic light emitting diode display panel. The corrosion of water and oxygen causes the optical function of the organic light emitting layer to fail, and undesirable black spots are generated at the position corresponding to the failed organic light emitting layer in the display screen, which seriously affects the display effect of the organic light emitting diode display panel.

SUMMARY

According to an aspect of the present disclosure, a display panel is provided, which comprises: a first layer; a first adhesive layer on the first layer; an array substrate on the first adhesive layer; a second adhesive layer on the array substrate and comprising a same material as the first adhesive layer; and a second layer on the second adhesive layer and comprising a same material as the first layer.

According to a specific implementation, in the display panel provided by an embodiment of the present disclosure, both the first adhesive layer and the second adhesive layer comprise pressure sensitive adhesive.

According to a specific implementation, in the display panel provided by an embodiment of the present disclosure, both the first layer and the second layer comprise polyethylene terephthalate.

According to a specific implementation, in the display panel provided by an embodiment of the present disclosure, at least one side of the display panel is bent in a direction toward the first layer.

According to a specific implementation, the display module provided by an embodiment of the present disclosure further comprises a transparent conductive layer on the second layer, the transparent conductive layer comprising indium tin oxide.

According to a specific implementation, the display panel provided by an embodiment of the present disclosure further comprises a polarizing layer on the transparent conductive layer.

According to a specific implementation, in the display panel provided by an embodiment of the present disclosure, the display panel comprises an organic light emitting diode display panel.

According to another aspect of the present disclosure, a display device which comprises the display panel described in any of the foregoing embodiments is provided.

According to yet another aspect of the present disclosure, a method for manufacturing a display panel is provided, the method comprises the steps of: providing a first layer; providing a first adhesive layer on the first layer; forming an array substrate on the first adhesive layer; forming a second adhesive layer on the array substrate, the second adhesive layer comprising a same material as the first adhesive layer; and forming a second layer on the second adhesive layer, the second layer comprising a same material as the first layer.

According to a specific implementation, the method for manufacturing the display panel provided by an embodiment of the present disclosure further comprises: before the step of forming a second adhesive layer on the array substrate, forming a treatment layer on the array substrate; bending at least one side of the display panel in a direction toward the first layer; irradiating the treatment layer with ultraviolet light; and peeling off the treatment layer.

According to a specific implementation, in the method for manufacturing the display panel provided by an embodiment of the present disclosure, the step of forming a treatment layer on the array substrate comprises: forming an ultraviolet light sensitive layer on the array substrate; and forming a polyethylene terephthalate layer on the ultraviolet light sensitive layer.

According to a specific implementation, in the method for manufacturing the display panel provided by an embodiment of the present disclosure, the step of irradiating the treatment layer with ultraviolet light comprises: irradiating the ultraviolet light sensitive layer with ultraviolet light through the polyethylene terephthalate layer so as to reduce the adhesion between the ultraviolet light sensitive layer and the array substrate.

According to a specific implementation, in the method for manufacturing the display panel provided by an embodiment of the present disclosure, the first layer comprises a polyethylene terephthalate layer, and the first adhesive layer comprises a pressure sensitive adhesive. The step of forming a second adhesive layer on the array substrate comprises: forming a pressure sensitive adhesive layer on the array substrate; and the step of forming a second layer on the second adhesive layer comprises: forming a polyethylene terephthalate layer on the second adhesive layer.

According to a specific implementation, the method for manufacturing the display panel provided by an embodiment of the present disclosure further comprises: forming a transparent conductive layer on the second layer; and forming a polarizing layer on the transparent conductive layer.

According to a specific implementation, in the method for manufacturing the display panel provided by an embodiment of the present disclosure, the step of forming a transparent conductive layer on the second layer comprises: forming an indium tin oxide layer on the second layer.

BRIEF DESCRIPTION OF DRAWINGS

The embodiments of the present disclosure will be further described below in a non-limiting manner and with reference to the accompanying drawings, in which.

DETAILED DESCRIPTION OF EMBODIMENTS

Figure 1:
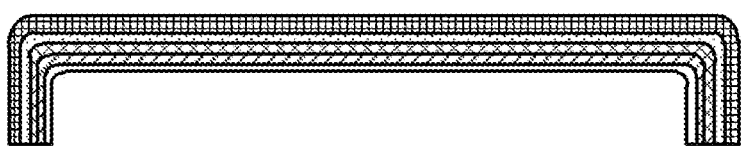
FIG. 1 schematically shows a cross-sectional view of a display panel in the related art.

In the drawings, the corresponding components in the drawings are denoted by the following reference signs:

10: display panel; 11: film structure; 12: array substrate; 13: optically clear adhesive layer; 14: touch layer; 15: polarizing layer; 100: display panel; 101: first layer; 102: first adhesive layer; 103: array substrate; 104: second adhesive layer; 105: second layer; 106: transparent conductive layer; 107: polarizing layer; 108: treatment layer; 200: display panel.

As mentioned above, full-screen display products are increasingly favored by consumers due to their superior visual experience. FIG. 1 schematically shows a cross-sectional view of a display panel 10 in the related art. The display panel 10 comprises a film structure 11, an array substrate 12, an optically clear adhesive (OCA) layer 13, a touch layer 14, and a polarizing layer 15. The array substrate 12 may be an organic light emitting diode array substrate. The Optically clear adhesive has the characteristics of colorless and transparent, high transmittance, high adhesion, high temperature resistance, ultraviolet (UV) resistance and so on. The touch layer 14 comprises a cycloolefin polymer (COP) layer as a base layer and a transparent conductive layer (for example, indium tin oxide). In the case where the touch layer 14 is included, the display panel 10 may be a display panel integrating touch and display functions.

When the edges of both sides of the display panel 10 are bent, the layers in the array substrate 12 are prone to generate relatively concentrated stress during the bending process, thereby generating undesirable cracks. In the subsequent reliability test process, water and oxygen in the environment penetrate the array substrate 12 along the cracks and corrode the organic light emitting layer of the array substrate 12, so that the optical function of the organic light emitting layer corroded by water and oxygen fails. Undesirable black spots are thus generated in the display screen at the position corresponding to the failed organic light emitting layer, which seriously affects the display effect.

During bending the edges of both sides of the display panel 10, since the outer layers of the display panel 10 (i.e. the layers away from the film structure 11) are tensioned and the inner layers of the display panel 10 (i.e. the layers close to the film structure 11) are squeezed, there will be a transition layer (i.e. a neutral layer) that is neither tensioned nor squeezed on its cross-section. The neutral layer has almost zero stress and therefore has better bending resistance. Based on this, the inventors of the present application has concluded that by changing the structures of one or more layers in the display panel, the structures on both sides of the array substrate are arranged as symmetrically as possible, so that the array substrate in the display panel is located at a position of the neutral layer and hence the bending resistance of the display panel can be improved accordingly.

Hereinafter, the display panel according to the embodiments of the present disclosure will be described in detail with reference to the accompanying drawings. It should be noted that the structures of the display panel according to some embodiments of the present disclosure are described in detail in the following description and are illustrated in the accompanying drawings as an example only. However, all these exemplary illustrations and descriptions should not be regarded as any limitation to the present disclosure. In fact, with benefiting from the technical teachings of the present disclosure, those skilled in the art will be able to conceive other suitable alternatives according to actual conditions.

Figure 2:
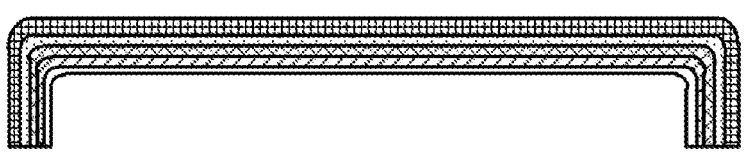
FIG. 2 schematically shows a cross-sectional view of a display panel according to an embodiment of the present disclosure.

FIG. 2 schematically shows a cross-sectional view of a display panel 100 according to an embodiment of the present disclosure (in which some elements are omitted for clarity).

As shown in FIG. 2, the display panel 100 comprises a first layer 101, a first adhesive layer 102 located on the first layer 101, an array substrate 103 located on the first adhesive layer 102, a second adhesive layer 104 that is located on the array substrate 103 and comprises a same material as the first adhesive layer 102, and a second layer 105 that is located on the second adhesive layer 104 and comprises a same material as the first layer 101.

When bending the edges of both sides of the display panel during the manufacturing process, the layers in the display panel may be under one of the following states depending on their positions: tension, squeeze, neither tension nor squeeze. Since the array substrate may produce undesirable cracks under tension or squeeze, it is desirable to enable the structures on both sides of the array substrate in the display panel to be arranged as symmetrically as possible by designing the structures of respective layers in the display panel, so that the array substrate can be placed at the position of the transition layer (i.e., the neutral layer) that is neither tensioned nor squeezed. In the display panel 100 provided by the embodiment of the present disclosure, the lower side of the array substrate 103 is provided with the first layer 101 and the first adhesive layer 102, and the upper side of the array substrate 103 is provided with the second adhesive layer 104 and the second layer 105. Since the first layer 101 and the second layer 105 have the same material, and the first adhesive layer 102 and the second adhesive layer 104 also have the same material, the array substrate 103 is in a symmetrical arrangement. That is, the array substrate 103 is at the position of the neutral layer. As a result, the stress on the array substrate 103 should theoretically be almost zero and therefore the array substrate 103 should have good bending resistance.

At least one side of the display panel 100 is bent in a direction toward the first layer 101. In the example shown in FIG. 2, both sides of the display panel 100 are bent in the direction toward the first layer 101. In an alternative implementation, one, three, or four sides of the display panel 100 may also be bent in the direction toward the first layer 101. The angle between the at least one bended side and the middle flat portion of the display panel 100 can be flexibly selected according to design requirements, for example, the angle can be any one between 0° to 180°.

Both the first layer 101 and the second layer 105 comprise polyethylene terephthalate (PET). In this case, the first layer 101 and the second layer 105 are flexible and transparent. In an alternative implementation, the first layer 101 and the second layer 105 may also comprise other suitable materials, but it is necessary to ensure that the first layer 101 and the second layer 105 are composed of the same material.

Both the first adhesive layer 102 and the second adhesive layer 104 comprise pressure sensitive adhesive (PSA). Pressure sensitive adhesive can be divided into rubber-type pressure sensitive adhesive and resin-type pressure sensitive adhesive according to main composition. Rubber-type pressure sensitive adhesive mainly includes natural rubber and synthetic rubber; resin-type pressure sensitive adhesive mainly includes acrylic type, silicone type and polyurethane type. In addition to the main rubber, the rubber-type pressure sensitive adhesive also includes other auxiliary compositions such as tackifying resin, plasticizer, filler, viscosity modifier, vulcanizer, antioxidant, and solvent. In addition to the main resin, the resin-type pressure sensitive adhesive also includes other auxiliary agents such as defoamer, leveling agent, and wetting agent. It should be noted that the term "pressure sensitive adhesive" as used herein does not refer to a specific adhesive, but refers to a type of adhesive that is sensitive to pressure. Generally, the peeling force of the pressure sensitive adhesive (the peeling force between the adhesive and the surface to which the adhesive adheres under pressure)<the cohesive force of the adhesive (the force between the pressure sensitive adhesive molecules) <the adhesive force to the substrate (the adhesion between the adhesive and the substrate). Such pressure sensitive adhesive generally does not exhibit undesirable phenomena such as degumming during use.

In a specific implementation, the array substrate 103 may be an organic light emitting diode array substrate. In this case, the display panel 100 is an organic light emitting diode display panel. The organic light emitting diode display panel may include an anode, a cathode, an organic light emitting layer between the anode and the cathode, a driving transistor, a plurality of gate lines, and a plurality of data lines. The organic light emitting diode display panel may include any appropriate structures according to design requirements, which is not limited in this embodiment.

Compared with the conventional display panel 10, the first adhesive layer 102 and the second adhesive layer 104 of the display panel 100 use pressure sensitive adhesive instead of optically clear adhesive, and the first layer 101 and the second layer 105 of the display panel 100 use polyethylene terephthalate layer instead of cycloolefin polymer layer. In this way, in the display panel 100, the lower side of the array substrate 103 is provided with the first layer 101 including the polyethylene terephthalate layer and the first adhesive layer 102 including the pressure sensitive adhesive, the upper side of the array substrate 103 is provided with the second adhesive layer 104 including the pressure sensitive adhesive and the second layer 105 including the polyethylene terephthalate layer. This structural design makes the array substrate 103 in a symmetrical arrangement, so that the array substrate 103 is at the position of the neutral layer.

Theoretically, when the edges of both sides of the display panel 100 are bent during the manufacturing process, the outer layers of the display panel 100 (i.e., the second adhesive layer 104 and the second layer 105) are tensioned, the inner layers of the display panel 100 (i.e., the first layer 101 and the first adhesive layer 102) are squeezed, while the array substrate 103 in the middle is neither tensioned nor squeezed (i.e., as a neutral layer). As a result, the stress on the array substrate 103 should be almost zero and therefore the array substrate 103 has good bending resistance.

In order to verify the rationality of the above-mentioned theory, the inventors of the present application conducted a bending test on the display panel 100 (for example, bended about 20,000 times in a continuous time), and found that the array substrate 103 in the display panel 100 has no defects such as cracks after the bending test. This confirms the correctness of the above-mentioned theory, and shows that the display panel 100 does have improved bending resistance.

In the display panel 100 provided by the embodiment of the present disclosure, by matching and designing the corresponding layers in the display panel 100, the array substrate 103 is in a position of the neutral layer. Correspondingly, when the display panel 100 is bent, since the stress on the array substrate 103 is almost zero, the array substrate 103 will not generate undesirable cracks, and therefore the water and oxygen in the environment cannot penetrate the array substrate 103. Obviously, this structural design is beneficial to improve the display effect of the display panel 100.

Figure 3:
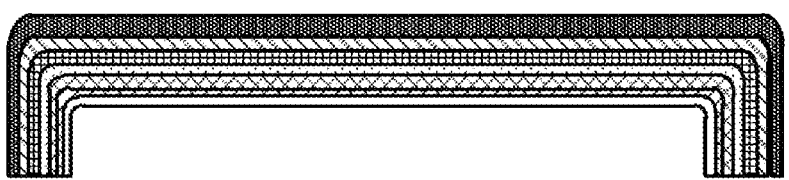
FIG. 3 schematically shows a cross-sectional view of a display panel according to another embodiment of the present disclosure.

It should be noted that, in order to facilitate a clear description of the structure of the display panel 100, only a part of the structures of the display panel 100 is shown in FIG. 3. However, those skilled in the art should clearly know that the structures of the display panel 100 are not limited to this, and it may also include other structures such as a pixel defining layer, a pixel circuit layer, a flat layer, an insulating layer, an encapsulation layer and so on, and these structures cooperate with each other to realize the required functions of the display panel 100.

FIG. 3 schematically shows a cross-sectional view of a display panel 200 according to another embodiment of the present disclosure (in which some elements are omitted for clarity).

Compared with the display panel 100, in addition to the first layer 101, the first adhesive layer 102, the array substrate 103, the second adhesive layer 104, and the second layer 105, the display panel 200 also includes a transparent conductive layer 106 on the second layer 105 and a polarizing layer 107 on the transparent conductive layer 106.

In a specific implementation, the second layer 105 and the transparent conductive layer 106 of the display panel 200 constitute a touch layer. In this case, the display panel 200 is a display panel integrating touch and display functions. For example, in a specific example, the transparent conductive layer 106 includes an indium tin oxide layer.

According to another aspect of the present disclosure, a display device is provided. The display device includes the display panel described in any of the previous embodiments. The display device can be any suitable device such as a television, a digital camera, a mobile phone, a watch, a tablet computer, a notebook computer, a navigator. Since the display device can solve basically the same technical problems as the above-mentioned display panel and achieve the same technical effects, for the sake of brevity, the technical effects of the display device will not be described repeatedly.

Figure 4:
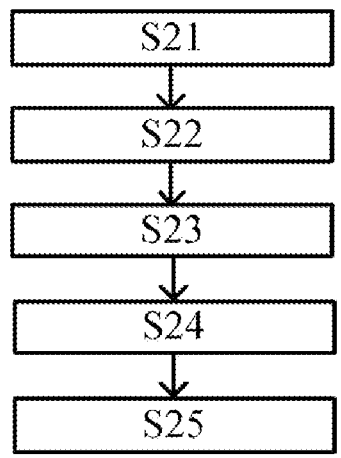
FIG. 4 schematically shows a flowchart of a method for manufacturing a display panel according to an embodiment of the present disclosure.

According to yet another aspect of the present disclosure, a method for manufacturing a display panel is provided. This method can be applied to the display panel described in any of the previous embodiments. FIG. 4 schematically shows a flowchart of a method for manufacturing a display panel according to an embodiment of the present disclosure. The method for manufacturing the display panel will be described below with reference to FIG. 2 and FIG. 4.

S21, providing a first layer 101.

S22, providing a first adhesive layer 102 on the first layer 101.

S23, forming an array substrate 103 on the first adhesive layer 102.

S24, forming a second adhesive layer 104 on the array substrate 103, the second adhesive layer 104 comprising a same material as the first adhesive layer 102.

S25, forming a second layer 105 on the second adhesive layer 104, the second layer 105 comprising a same material as the first layer 101.

In a specific example, the first layer 101 includes a polyethylene terephthalate layer, and the first adhesive layer 102 includes a pressure sensitive adhesive. Further, the step S24 of forming a second adhesive layer 104 on the array substrate 103 includes: forming a pressure sensitive adhesive layer on the array substrate 103. The step S25 of forming a second layer 105 on the second adhesive layer 104 includes: forming a polyethylene terephthalate layer on the second adhesive layer 104. That is, both the first layer 101 and the second layer 105 include a polyethylene terephthalate layer, and both the first adhesive layer 102 and the second adhesive layer 104 include a pressure sensitive adhesive.

According to an embodiment of the present disclosure, the array substrate 103 includes an organic light emitting diode array substrate. In this case, the formed display panel is an organic light emitting diode display panel. In the step S23 of forming the array substrate 103, multiple gate lines and multiple data lines crossing each other, thin film transistors, an anode of the organic light emitting diode, a cathode of the organic light emitting diode, and an organic light emitting layer between the anode and the cathode may be formed on the first adhesive layer 102. The organic light emitting diode array substrate can be formed according to a conventional manufacturing process, which will not be repeated in this embodiment.

Figure 5A:
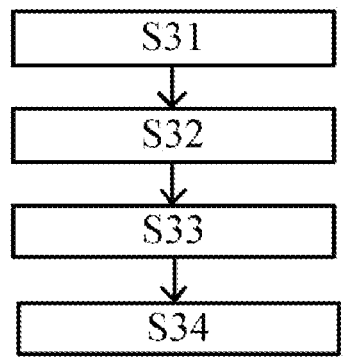
FIG. 5A schematically shows a flowchart of a method for manufacturing a display panel according to another embodiment of the present disclosure.
Figure 5B:
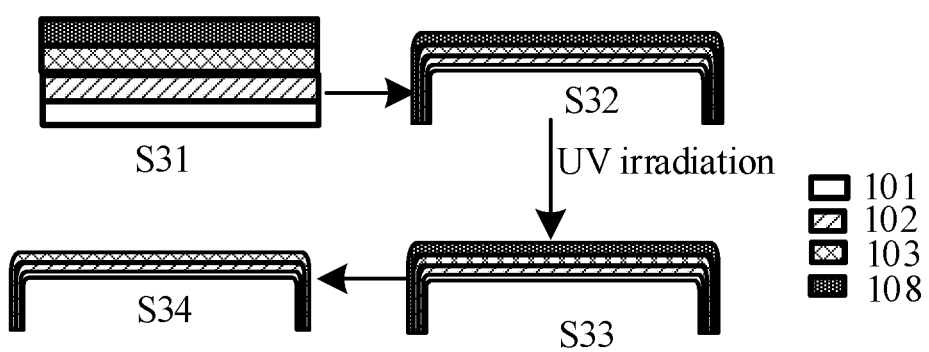
FIG. 5B schematically shows cross-sectional views of the display panel in different stages of the method of FIG. 5A.

FIG. 5A schematically shows a flowchart of a method for manufacturing a display panel according to another embodiment of the present disclosure, and FIG. 5B schematically shows a cross-sectional view of the display panel in different stages of the method of FIG. 5A. Referring to FIGS. 5A and 5B, the method for manufacturing the display panel may further include the following steps:

before the step S24 of forming a second adhesive layer 104 on the array substrate 103, S31, forming a treatment layer 108 on the array substrate 103.

S32, bending at least one side of the display panel in a direction toward the first layer 101.

S33, irradiating the treatment layer 108 with ultraviolet light.

S34, peeling off the treatment layer 108.

As a specific implementation, the step S31 of forming a treatment layer 108 on the array substrate 103 may include the following sub-steps: forming an ultraviolet light sensitive layer on the array substrate 103; and forming a polyethylene terephthalate layer on the ultraviolet light sensitive layer. That is, the formed treatment layer 108 includes the ultraviolet light sensitive layer and the polyethylene terephthalate layer on the ultraviolet light sensitive layer.

As a specific implementation, the step S33 of irradiating the treatment layer 108 with ultraviolet light may include the following sub-steps: irradiating the ultraviolet light sensitive layer with ultraviolet light through the polyethylene terephthalate layer so as to reduce the adhesion between the ultraviolet light sensitive layer and the array substrate 103.

Specifically, before the step S24 of forming a second adhesive layer 104 on the array substrate 103, the treatment layer 108 is attached to the array substrate 103, the treatment layer 108 includes the ultraviolet light sensitive layer and the polyethylene terephthalate layer on the ultraviolet light sensitive layer. The ultraviolet light sensitive layer has a structure similar to that of the pressure sensitive adhesive layer, but it additionally has the characteristic of reducing adhesion after being irradiated by ultraviolet light. In step S32, the two sides of the display panel are bent in the direction toward the first layer 101. Since the lower side of the array substrate 103 is provided with the first layer 101 including the polyethylene terephthalate layer and the first adhesive layer 102 including the pressure sensitive adhesive, and the upper side of the array substrate 103 is provided with the treatment layer 108 including the polyethylene terephthalate layer and the ultraviolet light sensitive layer (similar in structure to the pressure sensitive adhesive layer), so the array substrate 103 is in a symmetrical arrangement, so that the array substrate 103 is in a position of a neutral layer. Therefore, when the two sides of the display panel are bent in the direction toward the first layer 101, the outer layer of the display panel (i.e., the treatment layer 108) is tensioned, and the inner layers of the display panel (i.e., the first layer 101 and the first adhesive layer 102) are squeezed, while the array substrate 103 in the middle is neither tensioned nor squeezed (that is, as a neutral layer). Therefore, the stress on the array substrate 103 is almost zero, so that cracks are not easily generated during the bending process.

Then, in step S33, the ultraviolet light is irradiated onto the ultraviolet light sensitive layer through the polyethylene terephthalate layer. Since the ultraviolet light sensitive layer has the characteristic of reducing the adhesion after being irradiated by ultraviolet light, the adhesive force between the ultraviolet light sensitive layer and the array substrate 103 is significantly reduced after being irradiated by ultraviolet light. Then, the treatment layer 108 can be peeled off relatively easily.

In some implementations, the method for manufacturing the display panel may further include the following steps: after the treatment layer 108 is peeled off as well as the second adhesive layer 104 and the second layer 105 are sequentially formed on the array substrate 103, forming a transparent conductive layer 106 on the second layer 105 and forming a polarizing layer 107 on the transparent conductive layer 106. The step of forming a transparent conductive layer 106 on the second layer 105 may include the following sub-steps: forming an indium tin oxide layer on the second layer 105. In a specific example, the second layer 105 and the transparent conductive layer 106 constitute the touch layer of the display panel. In this case, the formed display panel is a display panel integrating touch and display functions.

Since the display panel has been bent in the above step S32, in the subsequent process of forming the transparent conductive layer 106 and the polarizing layer 107, the transparent conductive layer 106 and the polarizing layer 107 can be formed on the second layer 105 correspondingly according to the curvature of the display panel.

In the method for manufacturing the display panel provided by the embodiment of the present disclosure, the treatment layer 108 that is formed on the array substrate 103 and includes the polyethylene terephthalate layer and the ultraviolet light sensitive layer has the similar structure to the first layer 101 including the polyethylene terephthalate layer and the first adhesive layer 102 including the pressure sensitive adhesive layer below the array substrate 103. In this case, when the display panel composed of the first layer 101, the first adhesive layer 102, the array substrate 103 and the treatment layer 108 is bent, the array substrate 103 is almost at the position of the neutral layer, and the stress thereon is almost zero, so it is not easy to cause cracks during the bending process. Therefore, water and oxygen in the environment cannot penetrate the array substrate 103, so that the display effect of the display panel can be improved.

Those skilled in the art will understand that the term "substantially" herein may also include embodiments having "completely", "entirely", "all" and the like. Therefore, in the embodiment, the adjective substantial can also be removed. Where applicable, the term "substantially" may also refer to 90% or higher, such as 95% or higher, particularly 99% or higher, even more particularly 99.5% or higher, including 100%. The term "comprising" also includes embodiments in which the term "comprising" means "consisting of". The term "and/or" particularly relates to one or more of the items mentioned before and after "and/or". For example, the phrase "item 1 and/or item 2" and similar phrases may refer to one or more of item 1 and item 2. The term "comprising" may mean "consisting of" in an embodiment, but may mean "comprising at least the defined species and optionally one or more other species" in another embodiment.

In addition, the terms first, second, third, etc. in the specification and claims are used to distinguish between similar elements and are not necessarily used to describe sequence or chronological order. It should be understood that the terms so used are interchangeable under appropriate circumstances, and the embodiments of the present disclosure described herein can operate in other orders than those described or illustrated herein.

It should be noted that the above-mentioned embodiments illustrate rather than limit the present disclosure, and those skilled in the art will be able to design many alternative embodiments without departing from the scope of the appended claims. In the claims, any reference signs placed between parentheses shall not be construed as limiting the claim. The use of the verb "include" and its conjugations does not exclude the presence of elements or steps other than those stated in the claim. The article "a" or "an" before an element does not exclude the presence of multiple such elements. The mere fact that certain measures are recited in mutually different dependent claims does not indicate that the combination of these measures cannot be used to benefit.

The various aspects discussed in this patent can be combined to provide additional advantages. In addition, some of the features may form the basis of one or more divisional applications.

The invention claimed is:

1. A method for manufacturing a display panel, comprising the steps of:
   providing a first layer;
   providing a first adhesive layer on the first layer;
   forming an array substrate on the first adhesive layer;
   forming a second adhesive layer on the array substrate, the second adhesive layer comprising a same material as the first adhesive layer; and
   forming a second layer on the second adhesive layer, the second layer comprising a same material as the first layer,
   wherein the method further comprises: before the step of forming the second adhesive layer on the array substrate,
      forming a treatment layer on the array substrate;
      bending at least one side of an intermediate display panel in a direction toward the first layer, the intermediate display panel comprising the first layer, the first adhesive layer, the array substrate, and the treatment layer;
      irradiating the treatment layer with ultraviolet light; and
      peeling off the treatment layer.

2. The method according to claim 1, wherein the step of forming the treatment layer on the array substrate comprises:
   forming an ultraviolet light sensitive layer on the array substrate; and
   forming a polyethylene terephthalate layer on the ultraviolet light sensitive layer.

3. The method according to claim 2, wherein the step of irradiating the treatment layer with ultraviolet light comprises:
   irradiating the ultraviolet light sensitive layer with the ultraviolet light through the polyethylene terephthalate layer so as to reduce the adhesion between the ultraviolet light sensitive layer and the array substrate.

4. The method according to claim 1, wherein the first layer comprises a polyethylene terephthalate layer, and the first adhesive layer comprises a pressure sensitive adhesive,
   wherein the step of forming the second adhesive layer on the array substrate comprises:
   forming a pressure sensitive adhesive layer on the array substrate; and
   wherein the step of forming the second layer on the second adhesive layer comprises:
   forming a polyethylene terephthalate layer on the second adhesive layer.

5. The method according to claim 1, further comprising:
   forming a transparent conductive layer on the second layer; and
   forming a polarizing layer on the transparent conductive layer.

6. The method according to claim 5, wherein the step of forming the transparent conductive layer on the second layer comprises:
   forming an indium tin oxide layer on the second layer.

7. The method according to claim 1, wherein the step of forming the array substrate on the first adhesive layer comprises:
   forming an organic light emitting diode array substrate on the first adhesive layer.

* * * * *